United States Patent [19]

Bredin et al.

[11] Patent Number: 5,359,563
[45] Date of Patent: Oct. 25, 1994

[54] MEMORY SYSTEM WITH ADAPTABLE REDUNDANCY

[75] Inventors: Francis Bredin, Maisons Alfort; Thierry Cantiant, Dammarie-Les-Lys, both of France

[73] Assignee: International Business Machines Corporation, Armonk, N.Y.

[21] Appl. No.: 848,459

[22] Filed: Mar. 9, 1992

[30] Foreign Application Priority Data

Mar. 29, 1991 [EP] European Pat. Off. ......... 91480052.9

[51] Int. Cl.$^5$ ................................................ G11C 7/00
[52] U.S. Cl. .................................... 365/200; 365/225.7
[58] Field of Search ............................. 365/200, 225.7; 371/10.2

[56] References Cited

U.S. PATENT DOCUMENTS

| | | | |
|---|---|---|---|
| 3,753,244 | 8/1973 | Sumilas et al. | 340/172.5 |
| 4,635,232 | 1/1987 | Iwahashi et al. | 365/200 |
| 4,791,319 | 12/1988 | Tagami et al. | 365/200 |
| 4,935,899 | 6/1990 | Morigami | 365/200 |

OTHER PUBLICATIONS

Redundant/Normal Clock Generation for Redundant Word Line Addressing, IBM TDB, vol. 32, No. 8A, Jan. 1990, pp. 75–76.

*Primary Examiner*—Eugene R. LaRoche
*Assistant Examiner*—Son Dinh
*Attorney, Agent, or Firm*—Howard J. Walter, Jr.

[57] ABSTRACT

A memory system with adaptable redundancy comprises address decoding means (200) for the selection of one of the rows $R_1$ to $R_2(n+1)$ in the memory array, according to the binary value of address $A_0, A_1, \ldots A_{nn}$ incoming on bus 102. Block 200 comprises $2^{(n+1)}$ blocks 201 being able to drive an activation signal on leads $R_1$ to $R_2(n+1)$, and having an output connected to a lead 206.

Block 205 is able to drive an activation signal on lead RR according to signals present on leads 107 and 206, so as to select redundant row $RR_1$ without the use of a redundant address decoder.

4 Claims, 4 Drawing Sheets

MEMORY SYSTEM WITH ADAPTABLE REDUNDANCY

BACKGROUND OF THE INVENTION

1. Technical Field

The present invention relates to memory chips and computer systems in general, and more particularly to a memory system with adaptable redundancy for correcting defective memory cells.

2. Background Art

With the increase in size of produced memory chips, along with the decrease in size of the components on each chip, yield has become a major issue to chip manufacturers.

To increase that yield, manufacturing facilities have been improved by installing cleaner and less vibration-sensitive production tooling, and by applying specific mass-production techniques.

For the same purpose, on-chip redundancy techniques have also been used. Such techniques consist of developing, implementing and manufacturing on-chip 'extra' circuitry, which is capable of handling some of the functions normally performed by regular circuitry, if needed. The need arises when test results indicate that part of the regular circuitry is affected by manufacturing defects, and that one or a few functions, that can be isolated from the chip overall functionally, cannot be performed. The extra circuitry is used to functionally replace and correct the defective parts of the regular circuitry.

The choice of the amount of extra circuitry is critical because it decreases the amount of area for the regular circuitry. If both the amount of extra circuitry and the overall area of the chip are increased, more defects in the regular circuitry might be corrected, but at the same time chances are higher that there will be a manufacturing defect within the extra circuitry.

The redundancy technique is well-known in the prior art and can for example be found in U.S. Pat. No. 3,753,244 filed Aug. 18th, 1971, 'Yield Enhancement Redundancy Technique', *IBM Technical Disclosure Bulletin*, Vol.32, No 8A, Jan. 1990, p.75 and 76, "Redundant/Normal Clock Generation For Redundant Word Line Addressing." These techniques are applied to memory chips and systems which basically feature a memory array, composed of a large plurality of memory cells organized in rows and columns, selectable through address decoding means either for reading the cell content or for writing it.

A typical memory system with redundant circuitry as taught by any of the two above cited prior art documents is shown in FIG. 1. For the sake of clarity and ease of explanation, neither the memory array itself nor the address decoding means for the selection of a column in the memory array (according to the binary value of the address incoming on bus 103) are shown. Address decoding means (100) selects one of the rows $R_1$ to $R_2(n+1)$ (n being a positive integer) in the memory array, according to the binary value of address $A_0, A_1, \ldots A_n$ incoming on bus 102. As is well-known in the art, a row is selected when an active signal is propagated along a lead from the decoder corresponding to that row, making it possible to access the memory cells within that row for reading or writing their content. Therefore, the expressions 'select a row' and 'activation signal on lead' will be used interchangeably hereunder, and the reference '$R_1$ to $R_2(n+1)$' will apply to both the rows and their corresponding leads.

In block 100 there are $2^{(n+1)}$ identical blocks 101, which constitute the output driver sections of each decoder corresponding to each row, for physically driving the activation signal on one of the leads $R_1$ to $R_{27(n+1)}$. This output driver circuit can be quite often a single driver or inverter.

The redundant address decoder circuitry is composed of blocks 105 and 106, and their associated input and output signals. A 'FUSE CORPORATOR' 105, is able to select a redundant row $RR_1$, when the binary value of address $A_0, A_1, \ldots A_n$ on bus 102 matches the binary value provided by fuses $f_0, f_1, \ldots f_n$ on bus 104. When at least one memory cell within one of the rows $R_1$ to $R_2(n+1)$ appears to be defective, the binary value for the address corresponding to that row can be set to the fuses $f_0, f_1, \ldots f_n$ in any manner known in the art, (laser fuse blow, electrical fuse blow, EEPROM, etc.). Fuses $f_0, f_1, \ldots f_n$ can be selectively blown to be set to a value '0' or '1'. When an attempt is made to read or write the content of any of the memory cells within the faulty row, the redundant row is selected in its place, and the content of one of the redundant memory cells is read or written.

Block 106 'NORMAL ROW SELECTION ENABLE' ensures that there cannot be any simultaneous selection of one of the rows $R_1$ to $R_2(n+1)$, and the redundant row $RR_1$.

Control signal on lead 107 'CLK' controls and synchronizes the whole memory system operation in a manner well-known in the art.

Such an implementation of the redundant circuitry has the main following drawbacks:

When a redundant access occurs (i.e. the binary value for $A_0, A_1, \ldots A_n$ corresponds to the binary value of fuses $f_0, f_1, \ldots f_n$), there are two 'racing' parallel active paths in the memory system: one through blocks 100 and 101, and the other through blocks 105 and 106. Only the signal output by block 106 can prevent the redundant row $RR_1$ and one of the rows $R_1$ to $R_2(n+1)$ from being selected at the same time. Therefore, extra care is necessary in the design of blocks 105 and 106, as well as in their layout on a chip, to ensure that the signal output by block 106 will, in any case, be faster than any signal within block 100 that might select one of the rows $R_1$ to $R_2(n+1)$.

The layout of blocks 105 and 106 is not repetitive and breaks the regular layout of the memory array (not shown) and decoding circuitry (blocks 100 and 101), but still needs to be optimized so as to require as little chip extra space as possible. The layout is intricately dependent on the choice of implemented redundant circuitry, and cannot be easily adapted to any other circuitry. For example, a second redundant row cannot be easily provided, should it be necessary.

Moreover, current memory systems are quite often only sub-parts of a chip; a chip designer picks from a library of available macro functions a memory system of the desired capacity and organization (number of bits per word). To make those macro functions available, one needs to develop a 'growable' memory system, i.e. a memory system that is easily adjustable to any kind of capacity and organization as required by the chip designer, including adaptable redundant circuitry.

SUMMARY OF THE INVENTION

It is therefore an object of the present invention to provide a memory system with adaptable redundancy.

It is also an object of the invention to prevent 'race' conditions between the selection of a part of the memory array and a redundant section.

It is another object of the invention to provide an efficient means for deselecting access to a portion of the memory array to be replaced by redundancy.

It is yet another object of the invention to eliminate the redundant address decoder.

The invention includes a matrix of memory cells, decoding means in each dimension of the matrix for accessing the memory cells, and redundant memory cells with enabling circuitry. The decoding means in a first dimension of the matrix include first means for determining the part of the matrix to be duplicated, and disabling access to the determined part, and second means for enabling access to the redundant memory cells when the determined part of the matrix is attempted to be accessed, by controlling the enabling circuitry.

The invention thus provides a memory system with no 'racing' parallel active paths between the selection of 'normal' rows and the selection of redundant rows. The deselection of defective 'normal' rows and the selection of redundant rows is embedded within the decoding circuitry of the 'normal' rows, so that the redundancy scheme proposed is easily adaptable to any change in the size and organization of the matrix.

The invention specifically includes circuitry in the driver circuit meant for physically driving the activation signal on each 'normal' row in the memory array. This circuitry includes a fuse that can be blown to prevent any access to a specific 'normal' row (most likely because a defective memory cell has been detected within that row), and, on an attempt to still access that row, allow the access of a replacing redundant row.

BRIEF DESCRIPTION OF THE DRAWING

The invention will be better understood from the following detailed description read in conjunction with the following schematics.

DESCRIPTION OF THE PREFERRED EMBODIMENT OF THE INVENTION

Figure 2:
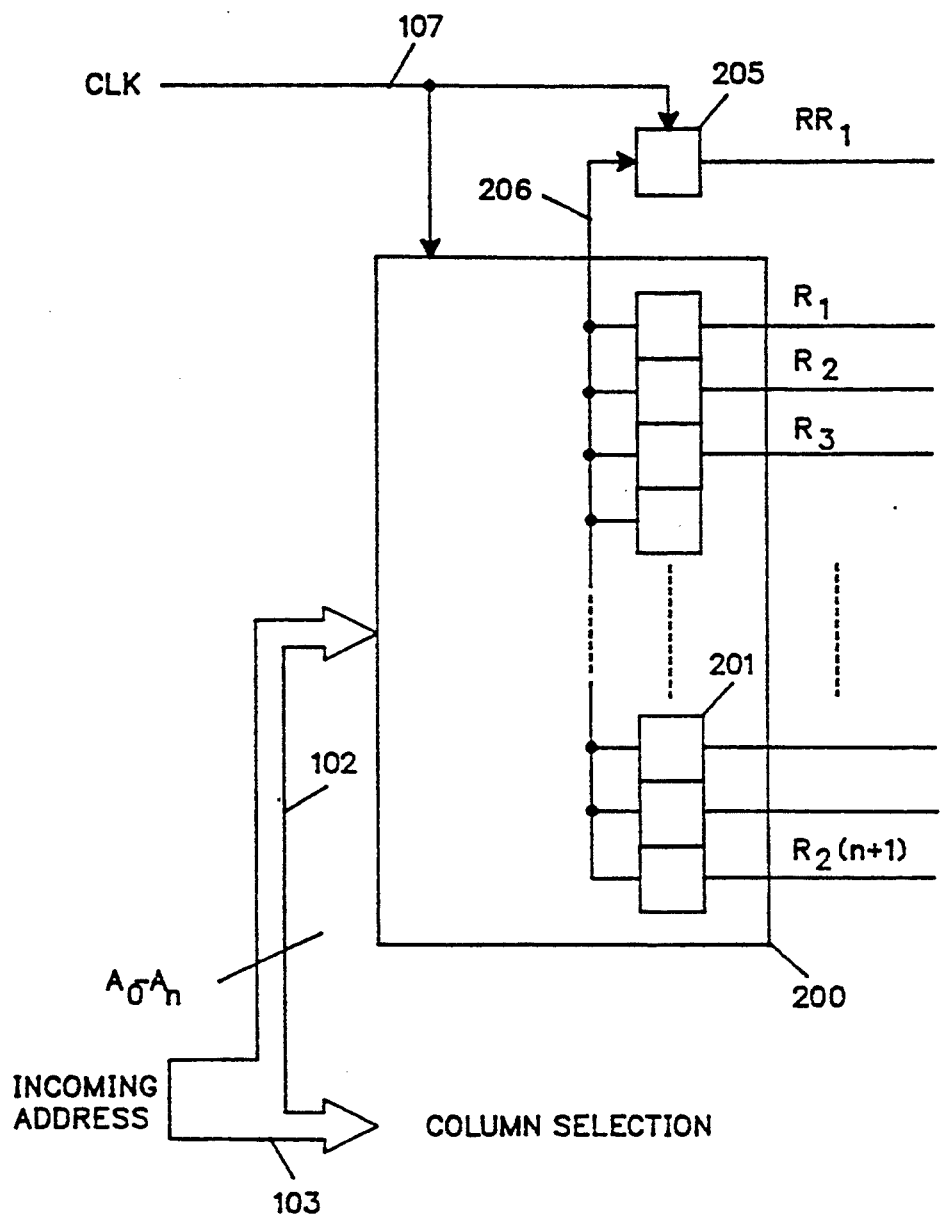
FIG. 2 is a circuit block diagram of a memory system and its associated redundant circuitry according to the present invention.

FIG. 2 shows a representation of a memory system and its associated redundant circuitry according to the present invention.

Address decoding means (200) selects one of the rows $R_1$ to $R_2(n+1)$ in the memory array, according to the binary value of address $A_0, A_1, \ldots A_n$ incoming on bus 102. Block 200 comprises $2^{(n+1)}$ blocks 201 being able to drive an activation signal on leads $R_1$ to $R_2(n+1)$, and having an output connected to a lead 206.

Figure 1:
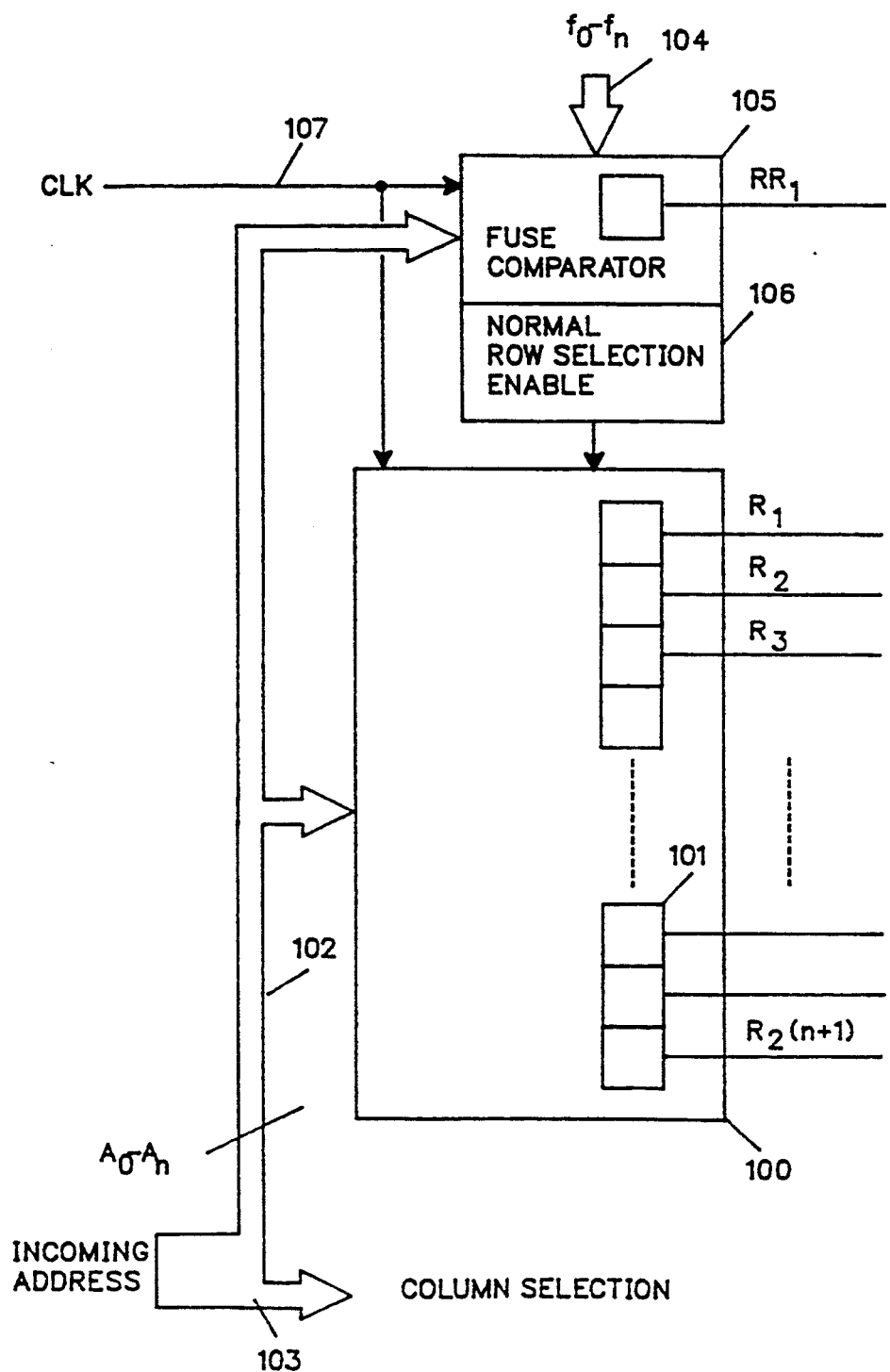
FIG. 1 is a circuit block diagram of a memory system and its associated redundant circuitry known from the prior art.

Block 205 is able to drive an activation signal on lead $RR_1$ according to signals present on leads 107 and 206, so as to possibly select redundant row $RR_1$. Contrary to the well-known redundancy scheme shown FIG. 1, in the invention redundancy is not selected directly by the address signal $A_0, A_1, \ldots A_n$, and therefore is not dependent on the size and organization of the memory array. The grouping (number and position in the array) of rows, one of which being correctable by redundant row $RR_1$, can be any row within the memory array as long as the output driver circuits for these rows share an output lead 206 that controls the activation signal on lead $RR_1$. Several redundant rows can be used, each servicing a group of rows sharing an output lead 206. These redundant rows introduce very little perturbation in the regular organization of the memory array.

Figure 3:
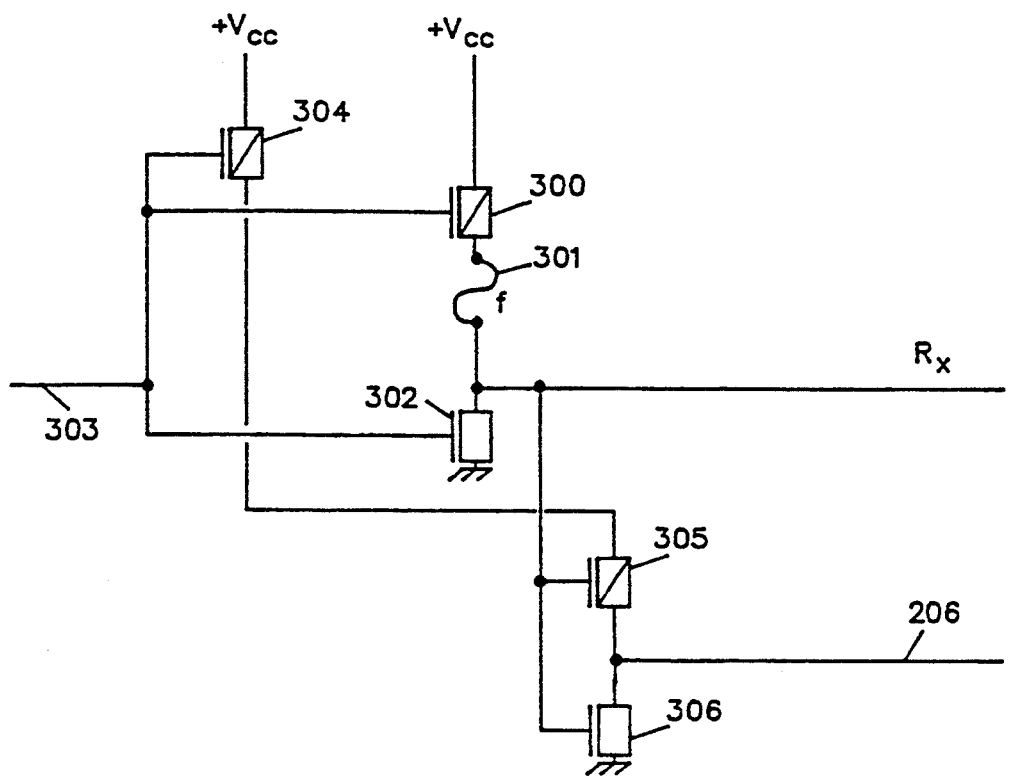
FIG. 3 is a detailed circuit diagram of block 201 from FIG. 2.

FIG. 3 is a detailed circuit diagram of any block 201 from FIG. 2. In a preferred embodiment, the circuitry of the invention is implemented in Complementary Metal Oxide Semiconductor (CMOS) technology.

Transistors P-FET (P-type field effect transistor) 300 and (n-type FET) N-FET 302 provide the driving capability for any of the leads $R_1$ to $R_2(n+1)$, referenced as $R_x$. Fuse 301 introduces negligible resistance and capacitance (the fuse can be realized in polysilicon, or even better, in small lands of metal) so that devices 300 and 302 provide a CMOS inverter function such that $R_x$ is activated (i.e. its value is equal to a binary '1') if a binary '0' is present on lead 303 (i.e. if the row $R_x$ is being attempted to be selected according to the decoding of address $A_0, A_1, \ldots A_n$ within block 200).

Transistors P-FET 304, P-FET 305 and N-FET 306 allow the value on lead 206 to be the result of a combination (equivalent to a NOR gate in static combinatory logic) of values on leads 303 and Rx according to the following table:

TABLE 1

| Rx | 303 | 206 |
| --- | --- | --- |
| 1 | — | 0 |
| 0 | 0 | 1 |
| 0 | 1 | 0 |

Figure 4:
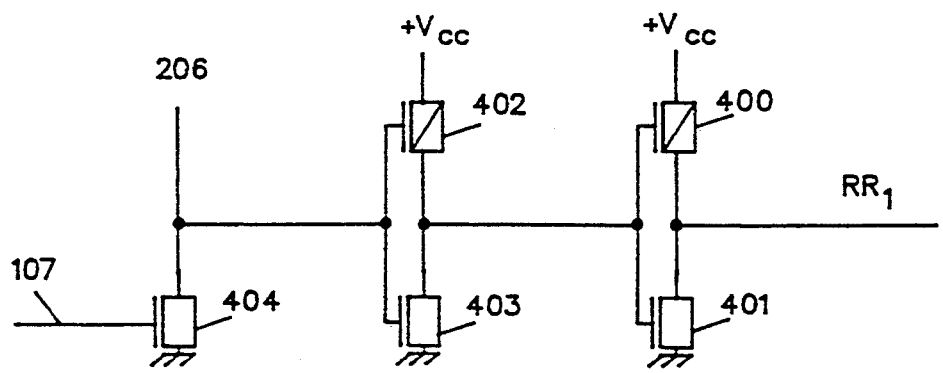
FIG. 4 is a detailed circuit diagram of block 205 from FIG. 2.

As leads 303 and $R_x$ have opposite values (Cf: inverter 300, 301, 302), the value on lead 206 is always a binary '0'. Referring to FIG. 4, which is a detailed circuit diagram of block 205 in FIG. 2., if lead 206 is at '0', the value on output lead RR1 can only be a binary '0,' whatever the value on lead 107 'CLK'. Transistors P-FET 400, N-FET 401, P-FET 402 and N-FET 403 form a non-inverting buffer that drives the signal on lead RR1.

When a defective memory cell is detected within one of the rows $R_1$ to $R_2(n+1)$, the fuse 301 in the driver 201 for the lead corresponding to that row is blown. The blown fuse disables the inverter operation of P-FET 300 and N-FET 302. The value on lead $R_x$ is clamped to a binary '0' thru transistor N-FET 302. According to Table 1, the value on lead 206 is from then on the opposite of the value on lead 303 (the CMOS inverter comprising transistors P-FET 304 and 305, and N-FET 306). Therefore, if the address signal A0-An selects a row $R_x$, such that the signal on line 303 is low, the value on lead 206 rises up to a binary '1', and, providing 107 is low, so does RR1. The redundant row is then selected.

Figure 5:
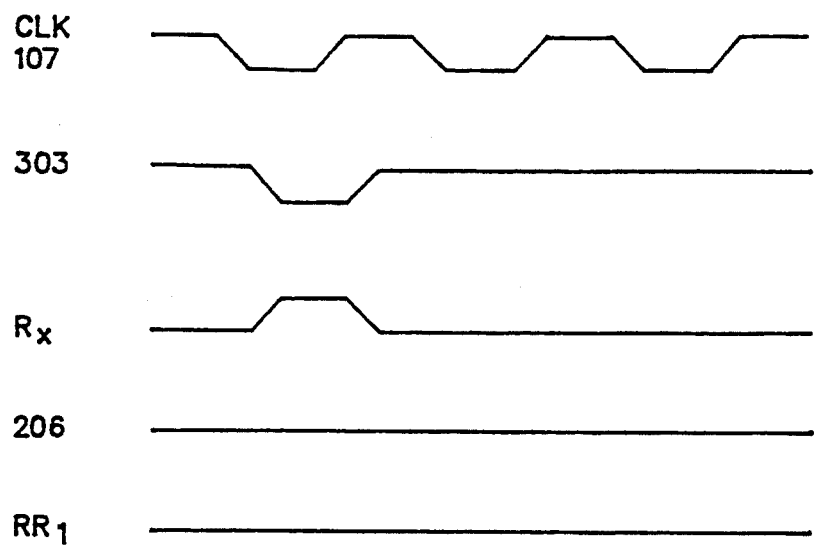
FIG. 5 is a timing diagram of the circuitry of FIG. 2 for the case of a row of the memory array being selected.

FIG. 5 shows a timing diagram in the case of a row of the memory array being selected. There has been no defective cell detected within the selected row; therefore, the fuse 301 has not been blown, and the value on lead $R_x$ rises to a binary '1'.

Figure 6:
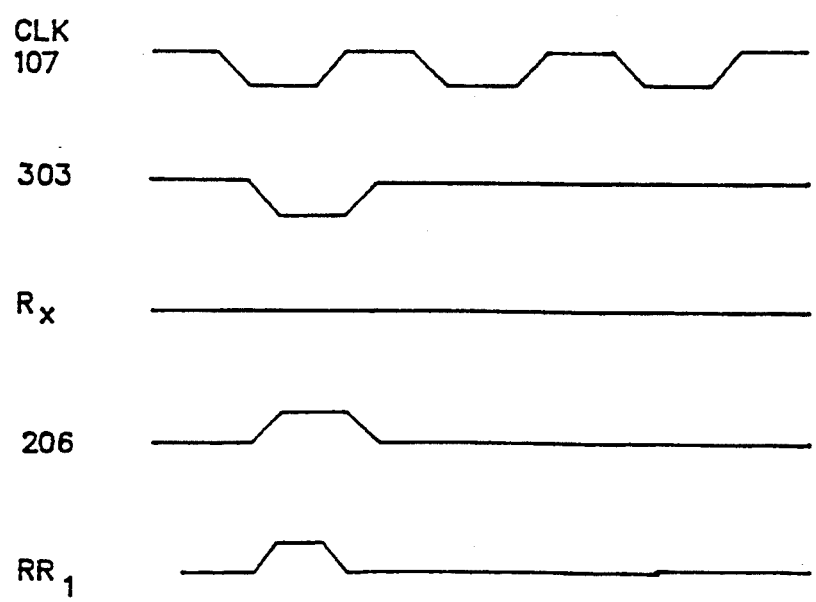
FIG. 6 is a timing diagram of the circuitry of FIG. 2 for the case of a redundant row of the memory system being selected.

FIG. 6 shows a timing diagram in the case of a redundant row of the memory system being selected. There has been a defective cell being detected within the selected row; therefore, the fuse 301 has been blown, and the value on lead $R_x$ sticks to a binary '0', such that the value on lead $RR_1$ rises to a binary '1' and the redundant row is selected.

In case of any special requirement that node $R_x$ must not be left floating at all (referring to FIG. 3 and FIG. 6, when fuse 301 is blown and row $R_x$ is addressed, i.e. when the value on lead 303 falls to a binary '0', node $R_x$ is floating for some time), a conventional latch composed of two cross-coupled inverters can have one of its two nodes connected to node $R_x$ (not shown).

Although the invention has been described in a particular embodiment, the teachings thereof are sufficient to facilitate adaptation of the invention in a system manufactured in technologies other than CMOS (for example, MOS or BICMOS), or in a system where the redundancy technique is applied to columns of the memory array, instead of rows.

We claim:

1. A memory system comprising an array of memory elements interconnected into a plurality of lines of memory elements; a plurality of address decoders, each responding to an address signal to activate one of said plurality of lines of memory elements; at least one line of redundant memory elements; a first means producing a deselect output signal that prevents normal activation of a respective one of said plurality of lines of memory elements that is faulty by a respective one of said plurality of address decoders; and a second means for enabling at least one line of redundant memory elements; characterized by each of said plurality of address decoders comprising a decode section and an output driver section and wherein each output driver section comprises a first FET of a first conductivity type coupled between a first power supply and an output line, a second FET of a second conductivity type coupled between a second power supply and said output line, said first and second FETs having gate electrodes coupled to one another and to an output of said decode section.

2. The memory system of claim 1 wherein said first means is coupled to said output driver section.

3. The memory system of claim 1 wherein said first means is coupled to said output line.

4. The memory system of claim 3 wherein said first means comprises a fuse.

* * * * *